(12) United States Patent
Wang et al.

(10) Patent No.: US 8,981,521 B1
(45) Date of Patent: Mar. 17, 2015

(54) LATERAL BIPOLAR JUNCTION TRANSISTOR AND FABRICATION METHOD THEREOF

(71) Applicant: United Microelectronics Corp., Hsinchu (TW)

(72) Inventors: Chang-Tzu Wang, Taoyuan County (TW); Pei-Shan Tseng, Hsinchu (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/974,939

(22) Filed: Aug. 23, 2013

(51) Int. Cl.
  *H01L 29/735* (2006.01)
  *H01L 29/73* (2006.01)
  *H01L 29/66* (2006.01)

(52) U.S. Cl.
  CPC .......... *H01L 29/73* (2013.01); *H01L 29/66234* (2013.01); *H01L 29/6625* (2013.01); *H01L 29/735* (2013.01)
  USPC .......................................... 257/517; 257/592

(58) Field of Classification Search
  USPC ......................................... 257/517
  See application file for complete search history.

(56) References Cited

U.S. PATENT DOCUMENTS

| | | | |
|---|---|---|---|
| 5,355,015 A * | 10/1994 | McFarlane et al. | 257/554 |
| 6,249,031 B1 * | 6/2001 | Verma et al. | 257/378 |
| 8,421,124 B2 | 4/2013 | Lin et al. | |

* cited by examiner

*Primary Examiner* — Stephen W Smoot
(74) *Attorney, Agent, or Firm* — J.C. Patents

(57) ABSTRACT

Provided is a lateral BJT including a substrate, a well region, an area, at least one lightly doped region, a first doped region, and a second doped region. The substrate is of a first conductivity type. The well region is of a second conductivity type and is in the substrate. The area is in the well region. The at least one lightly doped region is in the well region below the area. The first doped region and the second doped region are of the first conductivity type and are in the well region on both sides of the area. The first doped region is connected to a cathode. The second doped region is connected to an anode, wherein the doping concentration of the at least one lightly doped region is lower than that of each of the first doped region, the second doped region, and the well region.

10 Claims, 10 Drawing Sheets

LATERAL BIPOLAR JUNCTION TRANSISTOR AND FABRICATION METHOD THEREOF

BACKGROUND OF THE INVENTION

1. Field of the Invention

The invention relates to the fabrication of an integrated circuit, and more particularly, to a lateral bipolar junction transistor (BJT) and a fabrication method thereof.

2. Description of Related Art

The transistor is a core device in the current electronic circuit. There are many types of transistors. Based on working principle, transistors can be divided into bipolar junction transistors (BJT) and field effect transistors (FET). BJTs are formed by a pn junction connected in opposite directions and have an emitter (E), a base (B), and a collector (C) as their three endpoints.

One of the main functions of BJTs is to serve as a switch, wherein there are two main uses. One is to switch a device having higher power; the other is to construct a digital logic circuit. Moreover, BJTs can amplify signals and have better power control, high-speed operation, and endurance ability, and are therefore frequently used to form amplifier circuits or to drive equipments such as speakers and electric motors, and are widely applied to the application products of aeronautics and space engineering, medical instruments, and robotics.

BJTs can also be applied to electrostatic discharge protection circuits. With the development of technology, the breakdown voltage of the current BJT is insufficient for the needs of the current device. For instance, in a process for making device operated between −VDD to 2.5VDD, the output swing is between −3.5 volts and 8.75 volts. It is difficult for traditional electrostatic discharge protection devices to satisfy the specified range. Moreover, the breakdown voltage of BJTs is only 7.7 volts, and therefore a BJT having a high breakdown voltage is needed.

SUMMARY OF THE INVENTION

The invention provides a plurality of lateral bipolar junction transistors. The lateral bipolar junction transistors have a high breakdown voltage.

The invention provides a plurality of lateral bipolar junction transistors. The lateral bipolar junction transistors can confine current in a small region such that the lateral bipolar junction transistors have a high breakdown voltage.

The invention provides a plurality of lateral bipolar junction transistors. The lateral bipolar junction transistors have a high breakdown voltage, can disperse an electric field, and increase the effect of heat dissipation.

The invention provides a fabrication method of the plurality of lateral bipolar junction transistors. The fabrication method is compatible with an existing fabrication process and does not need additional photomasks, and can increase the breakdown voltage of the lateral bipolar junction transistors.

The invention provides a fabrication method of the plurality of lateral bipolar junction transistors. The fabrication method can be compatible with an existing fabrication process and does not need additional photomasks, and can confine current in a small region to increase the breakdown voltage of the lateral bipolar junction transistors.

The invention provides a fabrication method of the plurality of lateral bipolar junction transistors. The fabrication method can be compatible with an existing fabrication process and does not need additional photomasks, and can increase the breakdown voltage of the lateral bipolar junction transistors. Moreover, the fabrication method can disperse an electric field and increase the effect of heat dissipation.

The invention provides a lateral bipolar junction transistor. The lateral bipolar junction transistor includes a substrate of a first conductivity type, a well region of a second conductivity type in the substrate, an area in the well region, at least one lightly doped region in the well region below the area, and a first doped region and a second doped region of the first conductivity type in the well region on both sides of the area, wherein the first doped region is connected to a cathode and the second doped region is connected to an anode, and wherein the doping concentration of the at least one lightly doped region is lower than the doping concentration of each of the first doped region and the second doped region, and is lower than the doping concentration of the well region.

In an embodiment of the invention, the first conductivity type is P-type and the second conductivity type is N-type.

In an embodiment of the invention, the first conductivity type is N-type and the second conductivity type is P-type.

In an embodiment of the invention, the at least one lightly doped region is of the first conductivity type.

In an embodiment of the invention, the at least one lightly doped region is of the second conductivity type.

In an embodiment of the invention, the at least one lightly doped region is a single doped region.

In an embodiment of the invention, the at least one lightly doped region is a plurality of doped regions.

In an embodiment of the invention, the lateral bipolar junction transistor further includes at least one isolation structure in the area, wherein the at least one isolation structure is adjacent to the first doped region and the second doped region.

In an embodiment of the invention, the at least one lightly doped region is in contact with the at least one isolation structure.

In an embodiment of the invention, the at least one lightly doped region is separated from the at least one isolation structure by a distance.

In an embodiment of the invention, the lateral bipolar junction transistor further includes a first isolation structure in the area and adjacent to the first doped region, and a second isolation structure in the area and adjacent to the second doped region.

The invention provides a fabrication method of a lateral bipolar junction transistor. The fabrication method includes forming at least one first well region of a first conductivity type in a substrate, forming a second well region of a second conductivity type in the substrate, wherein the first well region is in the second well region, the at least one first well region is partially overlapped with the second well region, and at least one lightly doped region is formed after the second well region is compensated, respectively forming a first doped region and a second doped region in the second well region, wherein the first doped region and the second doped region are respectively on both sides of an area on the lightly doped region, and connecting the first doped region to a cathode and connecting the second doped region to an anode.

In an embodiment of the invention, the first conductivity type is P-type and the second conductivity type is N-type.

In an embodiment of the invention, the first conductivity type is N-type and the second conductivity type is P-type.

In an embodiment of the invention, the at least one lightly doped region is of the first conductivity type.

In an embodiment of the invention, the at least one lightly doped region is of the second conductivity type.

In an embodiment of the invention, the at least one lightly doped region is a single doped region.

In an embodiment of the invention, the at least one lightly doped region is a plurality of doped regions.

In an embodiment of the invention, the method further includes forming at least one isolation structure in the area before forming the first well region, wherein the at least one isolation structure is adjacent to the first doped region and the second doped region.

In an embodiment of the invention, the at least one lightly doped region is in contact with the at least one isolation structure.

In an embodiment of the invention, the at least one lightly doped region is separated from the at least one isolation structure by a distance.

In an embodiment of the invention, the method further includes, before forming the first well region, forming in the area: a first isolation structure adjacent to the first doped region, and a second isolation structure adjacent to the second doped region.

The lateral bipolar junction transistors of the invention can increase the breakdown voltage thereof by disposing a lightly doped region below an area between doped regions connected to a cathode and an anode.

The lateral bipolar junction transistors of the invention can confine current in a small region to increase the breakdown voltage thereof by disposing a lightly doped region below an isolation structure, wherein the lightly doped region is separated from the isolation structure by a distance.

The lateral bipolar junction transistors of the invention can increase the breakdown voltage, disperse an electric field, and increase the effect of heat dissipation by disposing a lightly doped region below two separated isolation structures.

The fabrication method of the plurality of lateral bipolar junction transistors of the invention can be compatible with an existing fabrication process and does not need additional photomasks, and can increase the breakdown voltage of the lateral bipolar junction transistors.

The fabrication method of the plurality of lateral bipolar junction transistors of the invention can be compatible with an existing fabrication process and does not need additional photomasks, and can confine current in a small region to increase the breakdown voltage of the lateral bipolar junction transistors.

The fabrication method of the plurality of lateral bipolar junction transistors of the invention can be compatible with an existing fabrication process and does not need additional photomasks, and can increase the breakdown voltage of the lateral bipolar junction transistors. Moreover, the fabrication method can disperse an electric field and increase the effect of heat dissipation.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Regarding the lateral bipolar junction transistors (BJT) of the invention, in addition to forming two doped regions connected to a cathode and an anode in a well region, a lightly doped region is further formed below an area between the two doped regions. The conductivity type of the lightly doped region can be the same or different from the conductivity type of the well region. A single, two, or a plurality of isolation structures can be formed in the area between the two doped regions. The lightly doped region can be in contact with the one or a plurality of isolation structures or be separated from the one or a plurality of isolation structures by a distance. Since the doping concentration of the lightly doped region is lower than the doping concentration of each of the two doped regions and is lower than the doping concentration of the well region, the breakdown voltage of the lateral bipolar junction transistors can be increased. The invention is explained through a plurality of embodiments below. However, the lateral BJT of each of the embodiments is not limited thereto.

In the embodiments below, in the lateral BJTs, a first conductivity type is, for instance, P-type and a second conductivity type is, for instance, N-type (as shown in FIGS. 1 to 8B). However, the invention is not limited thereto. In another embodiment, in the lateral BJT, the first conductivity type is, for instance, N-type and the second conductivity type is, for instance, P-type. The P-type dopant is, for instance, boron or boron trifluoride. The N-type dopant is, for instance, phosphorous or arsenic.

Figure 1:
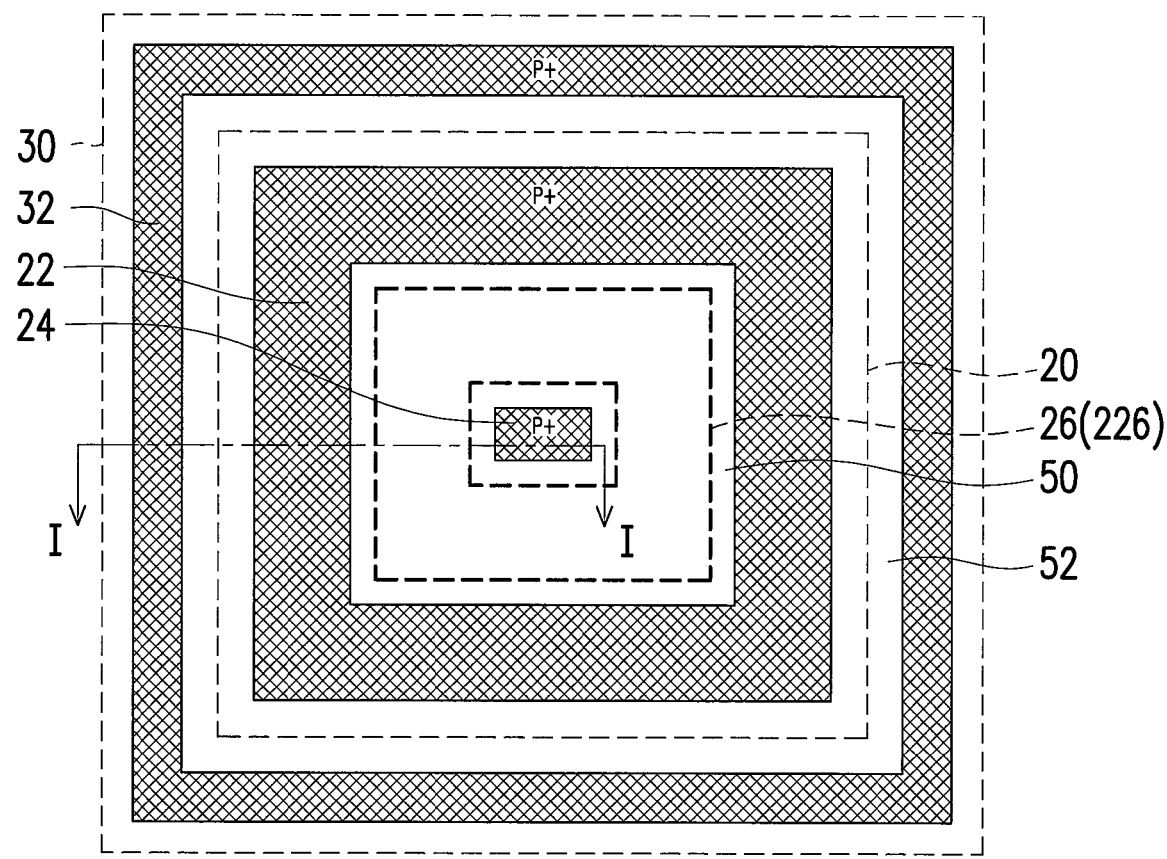
FIG. 1 illustrates a top view of a lateral bipolar junction transistor of an embodiment of the invention.
Figure 2A:
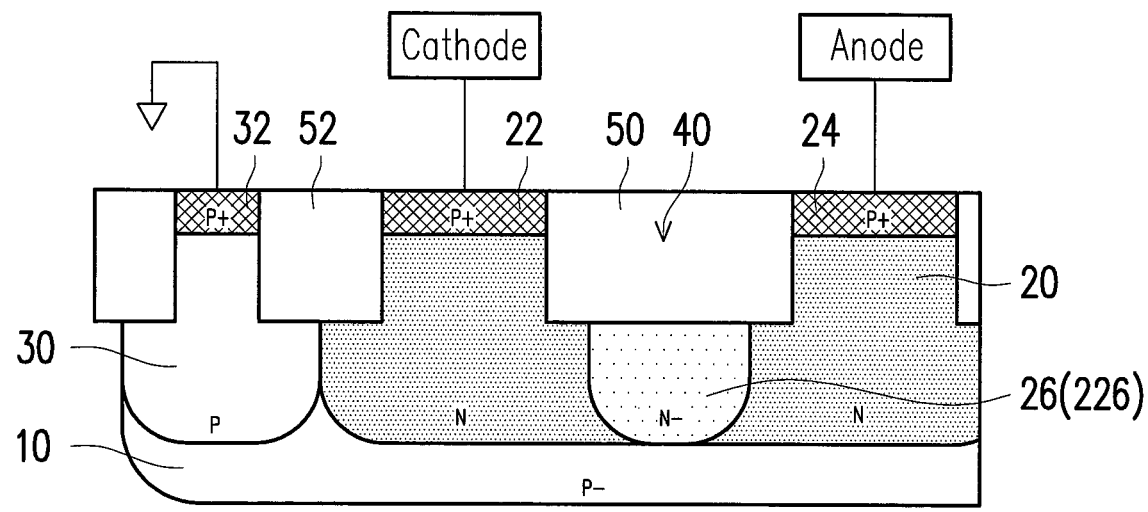
FIG. 2A illustrates a schematic cross-sectional diagram of one of the lateral bipolar junction transistors of line I-I of FIG. 1.

FIG. 1 illustrates a top view of a lateral BJT of an embodiment of the invention. FIG. 2A illustrates a schematic cross-sectional diagram of a lateral BJT of line I-I of FIG. 1.

Referring to FIG. 1 and FIG. 2A, the lateral BJT includes a substrate 10, a well region 20, doped regions 22 and 24, a lightly doped region 26, a well region 30, and a doped region 32.

The substrate 10 can be a semiconductor substrate such as a silicon substrate. The substrate 10 is of the first conductivity type.

The well region 20 is of the second conductivity type and is in the substrate 10. The doped regions 22 and 24 are of the first conductivity type and are in the well region 20.

The doped regions 22 and 24 are of the first conductivity type and are respectively connected to a cathode and an anode. In an embodiment, the doped region 22 is separated from an area 40 and surrounds the doped region 24.

The area 40 has a single isolation structure 50 therein. The isolation structure 50 is, for instance, a shallow trench isolation structure.

The lightly doped region 26 is of a second conductivity type and is in the well region 20 below the isolation structure 50 of the area 40. The doping concentration of the lightly doped region 26 is lower than the doping concentration of each of the doped region 22 and the doped region 24 and is lower than the doping concentration of the well region 20. In the present embodiment, the lightly doped region 26 is a single region and is in contact with the isolation structure 50. However, the embodiments of the invention are not limited thereto.

The well region 30 is of the first conductivity type and is in the periphery of the well region 20. In an embodiment, the well region 30 surrounds the well region 20.

The doped region 32 is of the first conductivity type and is in the well region 30. In an embodiment, the doped region 32 surrounds the periphery of the doped region 22. The doped region 32 and the doped region 22 can be separated by an isolation structure 52.

In the lateral BJT, since the lightly doped region 26 and the well region 20 are of the same conductivity type and the doping concentration of the lightly doped region 26 is lower than the doping concentration of the well region 20, the resistance of the lightly doped region 26 can be increased to increase the voltage across thereof and increase the breakdown voltage of the device.

Figure 2B:
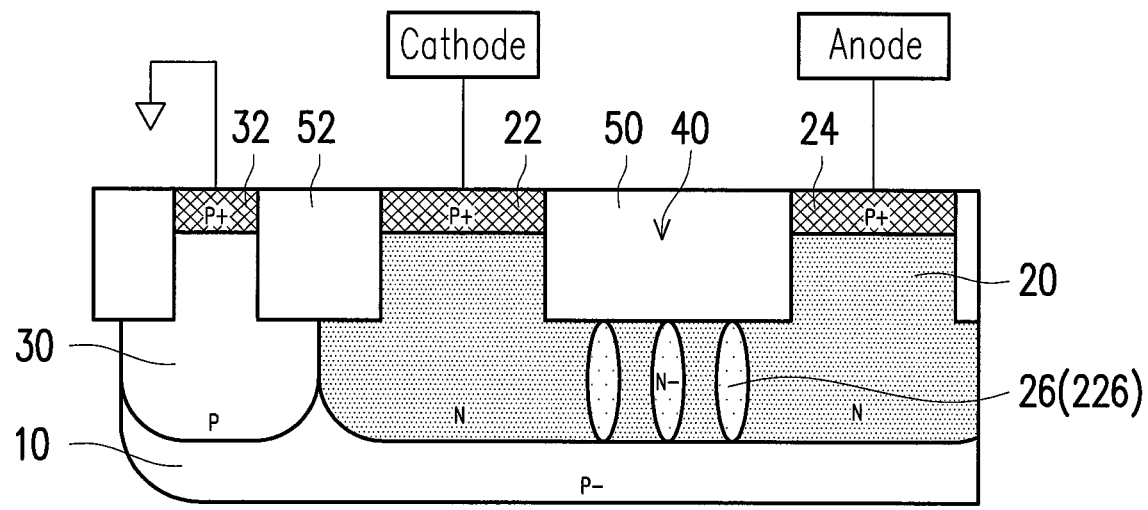
FIG. 2B illustrates a schematic cross-sectional diagram of another one of the lateral bipolar junction transistors of line I-I of FIG. 1.

FIG. 2B illustrates a schematic cross-sectional diagram of a lateral BJT of line I-I of FIG. 1.

In the embodiment of FIG. 2A, the lightly doped region 26 is a single region; however, the embodiments of the invention are not limited thereto. In another embodiment, as shown in FIG. 2B, there can be a plurality of lightly doped regions 26 below the isolation structure 50. In an embodiment, the lightly doped region 26 is juxtaposed below the isolation structure 50. In the present embodiment, by disposing a plurality of lightly doped regions 26 below the isolation structure 50, the breakdown voltage of the junction of the lightly doped region 26 and the well region 20 can be further increased.

Figure 2C:
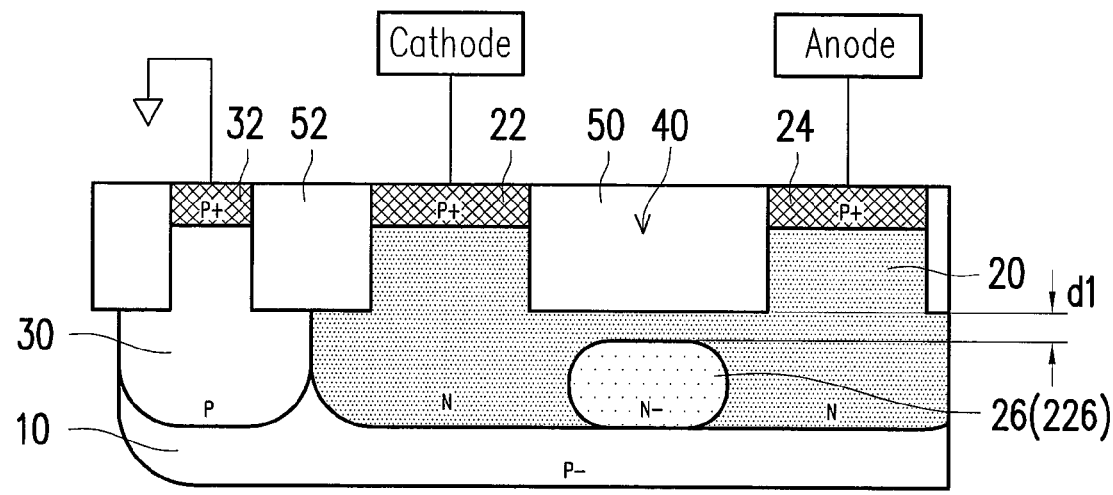
FIG. 2C illustrates a schematic cross-sectional diagram of yet another one of the lateral bipolar junction transistors of line I-I of FIG. 1.
Figure 2D:
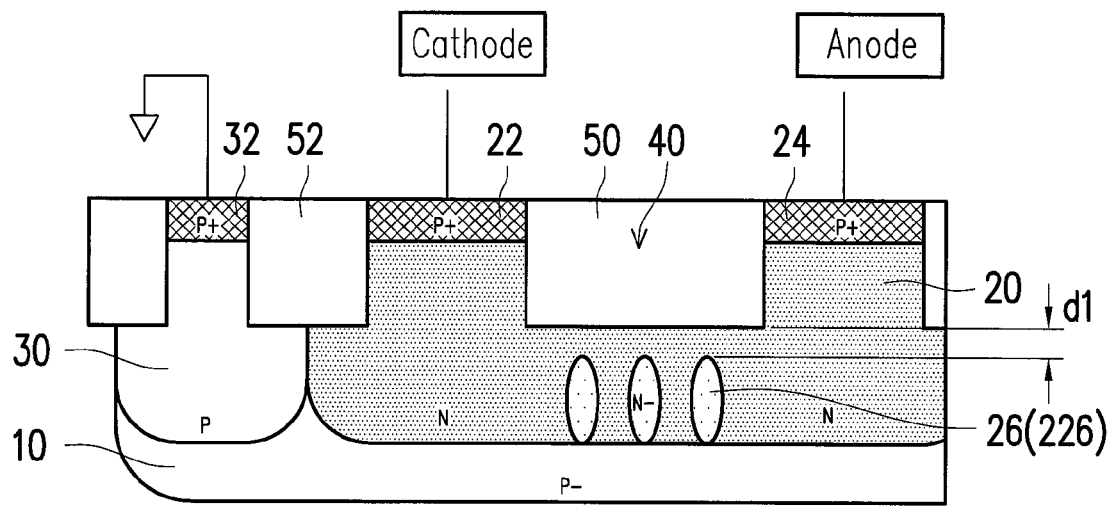
FIG. 2D illustrates a schematic cross-sectional diagram of still yet another one of the lateral bipolar junction transistors of line I-I of FIG. 1.

FIG. 2C illustrates a schematic cross-sectional diagram of yet another one of the lateral bipolar junction transistors of line I-I of FIG. 1. FIG. 2D illustrates a schematic cross-sectional diagram of yet another one of the lateral bipolar junction transistors of line I-I of FIG. 1.

In the embodiment of FIG. 2A, the lightly doped region 26 is in contact with the isolation structure 50. However, the embodiments of the invention are not limited thereto. In the embodiment of each of FIG. 2C and FIG. 2D, the lightly doped region 26 and the isolation structure 50 are separated by a distance d1 and are not in contact. The distance d1 is, for instance, 0.05 μm to 1 μm. Similarly, the lightly doped region 26 can be a single region as shown in FIG. 2C; and the lightly doped region 26 can also be a plurality of regions as shown in FIG. 2D. In comparison to a situation without the lightly doped region 26, in the present embodiment, the lightly doped region 26 is separated from the isolation structure 50 by the distance d1. As a result, the channel is smaller and current is confined in a small region, thereby increasing the breakdown voltage of the lateral bipolar junction transistor.

In the embodiment of each of FIG. 2A to FIG. 2D, a single isolation structure 50 is disposed in the area 40. However, the embodiments of the invention are not limited thereto.

Figure 3A:
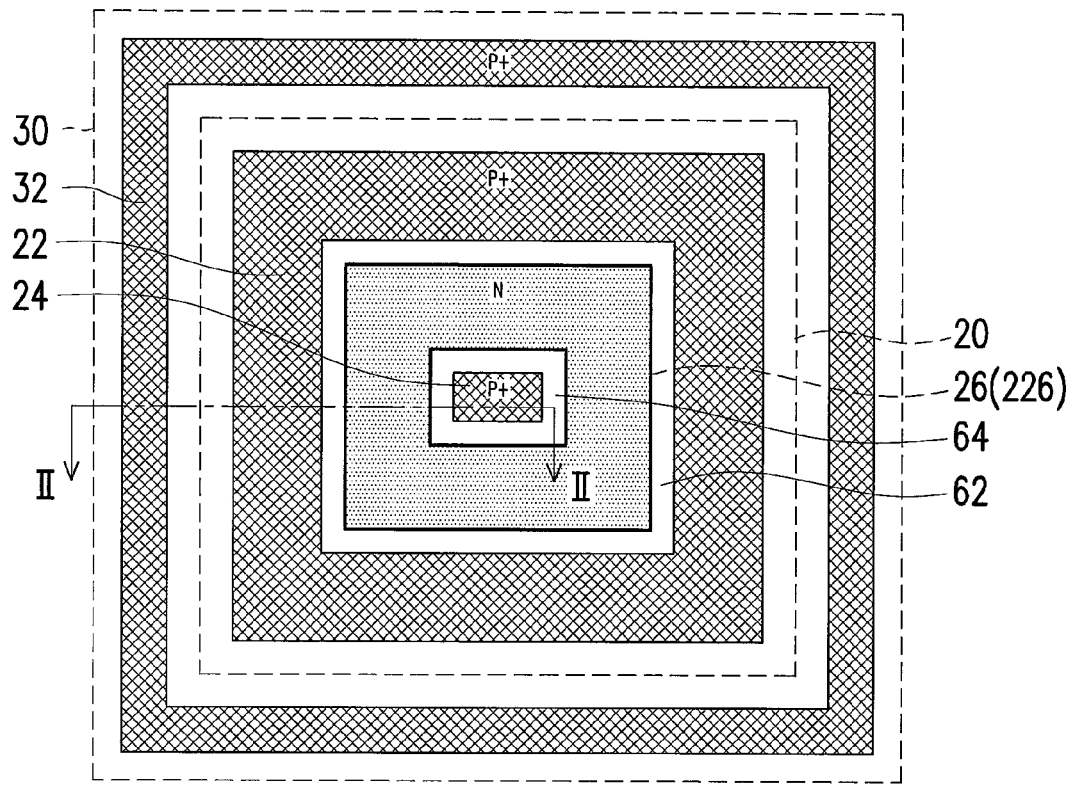
FIG. 3A illustrates a top view of yet another lateral bipolar junction transistor of an embodiment of the invention.
Figure 3B:
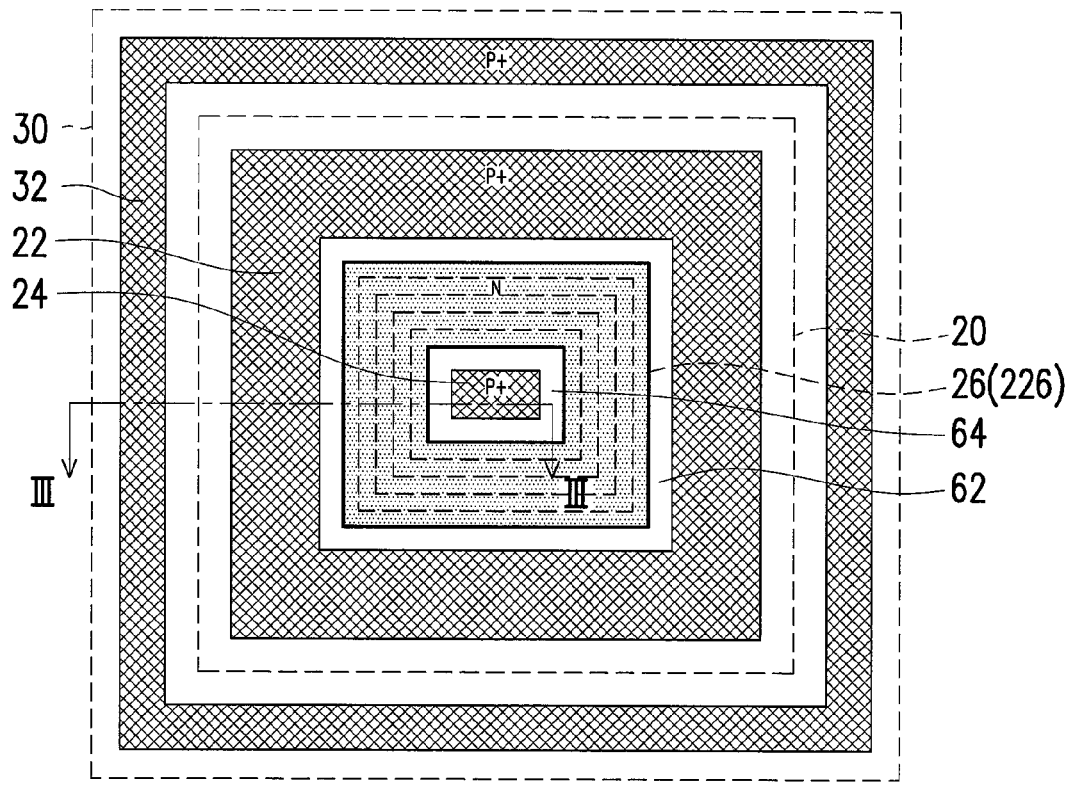
FIG. 3B illustrates a top view of another lateral bipolar junction transistor of an embodiment of the invention.
Figure 4A:
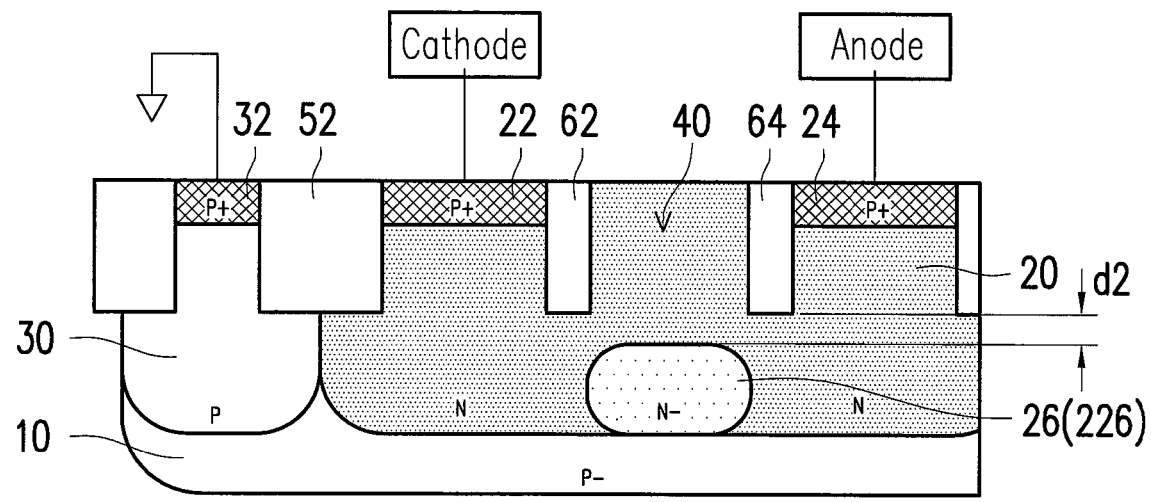
FIG. 4A illustrates a schematic cross-sectional diagram of line II-II in FIG. 3A.
Figure 4B:
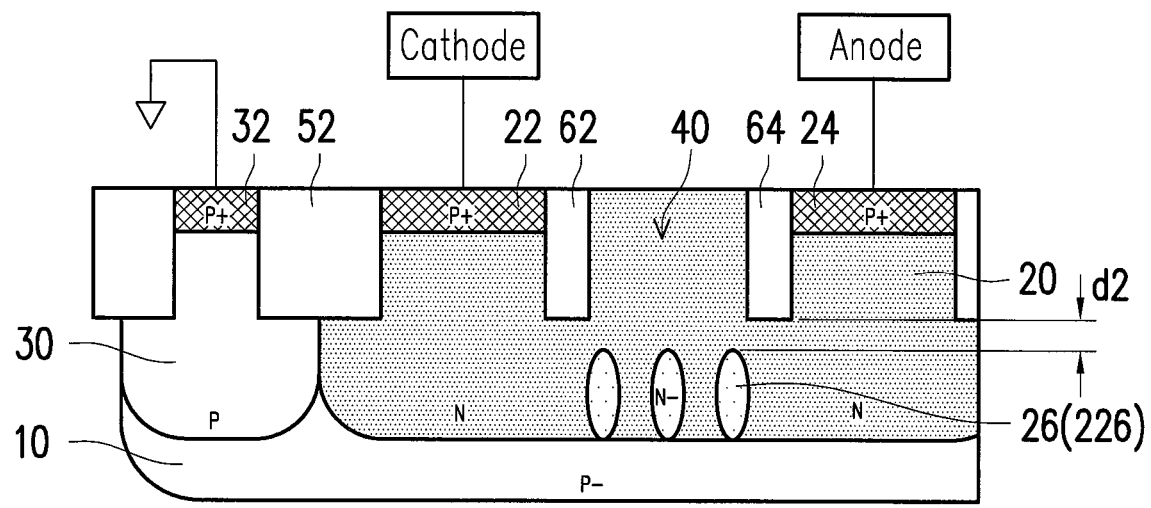
FIG. 4B illustrates a schematic cross-sectional diagram of line in FIG. 3B.

FIG. 3A and FIG. 3B respectively illustrate a top view of another lateral BJT of an embodiment of the invention. FIG. 4A illustrates a schematic cross-sectional diagram of line II-II in FIG. 3A. FIG. 4B illustrates a schematic cross-sectional diagram of line in FIG. 3B.

Referring to FIG. 3A and FIG. 4A, in the present embodiment, two separate isolation structures 62 and 64 are disposed in the area 40. The isolation structure 62 is in contact with the doped region 22 and the isolation structure 64 is in contact with the doped region 24. The area 40 reserved between the isolation structure 62 and the isolation structures 64 is a portion of the area 20. The lightly doped region 26 is disposed below the area 40, is not in contact with the isolation structures 62 and 64, and is separated from the isolation structures 62 and 64 by a distance d2. The distance d2 is, for instance, 0.05 μm to 1 μm. Similarly, the lightly doped region 26 can be a single region as shown in FIG. 3A and FIG. 4A; and the lightly doped region 26 can also be a plurality of regions as shown in FIG. 3B and FIG. 4B. In comparison to a situation without the lightly doped region 26, in the present embodiment, the lightly doped region 26 is separated from the isolation structure by the distance d2. As a result, the channel is smaller and current is confined in a small region, thereby increasing the breakdown voltage of the lateral bipolar junction transistor. However, in comparison to the situation of the embodiment of each of FIGS. 2C and 2D, in the present embodiment, the area 40 reserved between the isolation structure 62 and the isolation structure 64 can disperse an electric field to increase the effect of heat dissipation.

In the embodiment of each of FIG. 2A to FIG. 2D, FIG. 4A, and FIG. 4B, the conductivity type of the lightly doped region 26 below the area 40 is the same as the conductivity type of the well region 20 and is of the second conductivity type. However, the embodiments of the invention are not limited thereto. The conductivity type of the doped region below the area 40 can also be different from the conductivity type of the well region 20 and be of a first conductivity type as shown in FIG. 5, FIG. 6A to FIG. 6D, FIG. 7A, FIG. 7B, FIG. 8A, and FIG. 8B.

Figure 5:
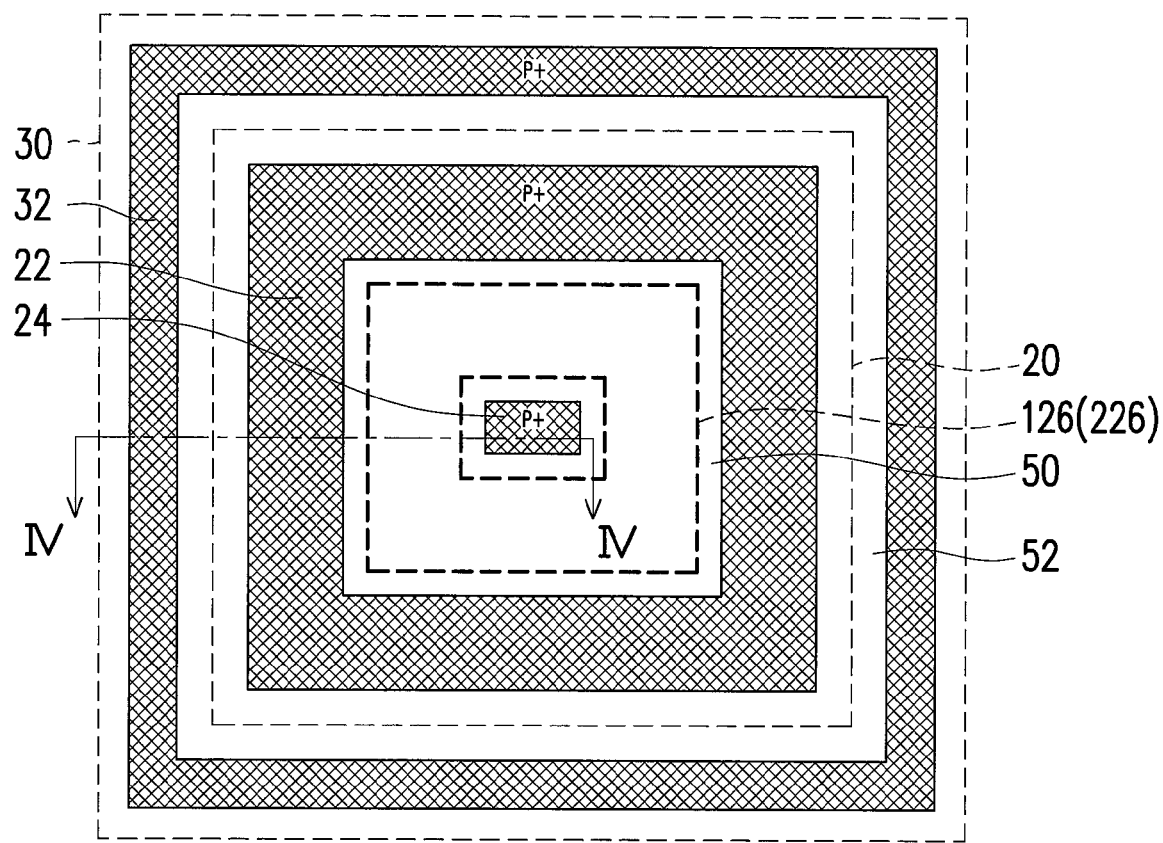
FIG. 5 illustrates a top view of a lateral bipolar junction transistor of an embodiment of the invention.
Figure 7A:
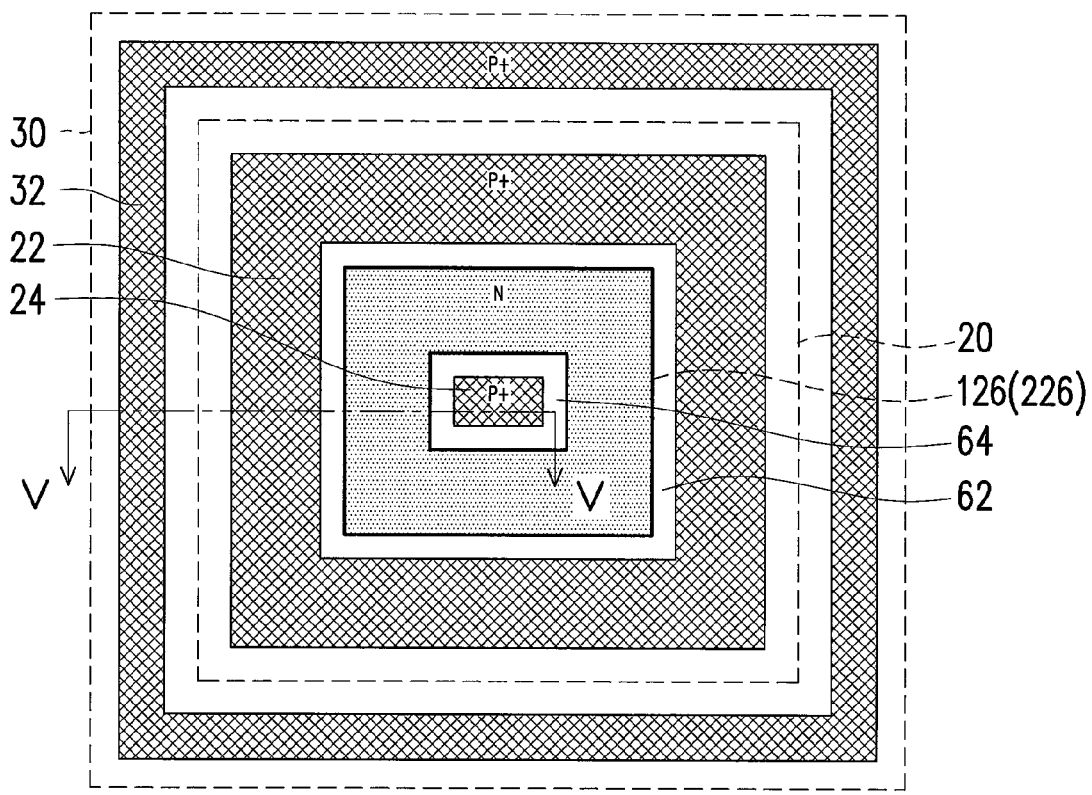
FIG. 7A illustrates a top view of yet another lateral bipolar junction transistor of an embodiment of the invention.
Figure 7B:
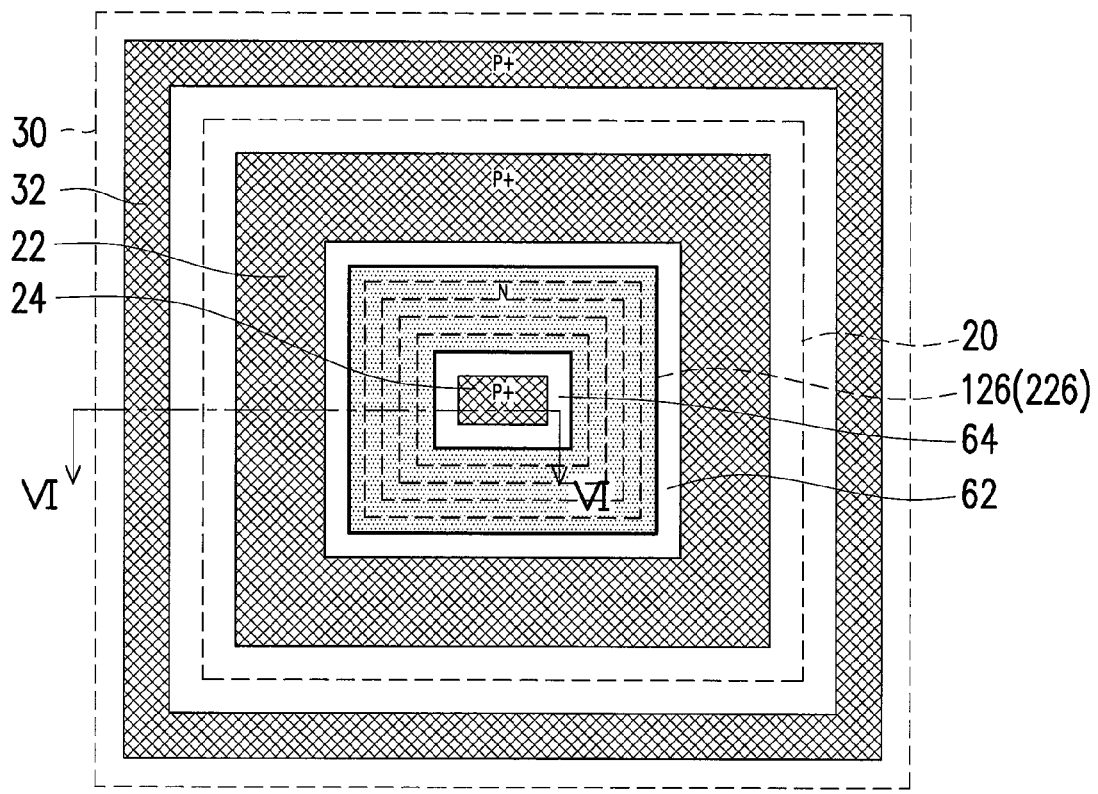
FIG. 7B illustrates a top view of another lateral bipolar junction transistor of an embodiment of the invention.
Figure 8A:
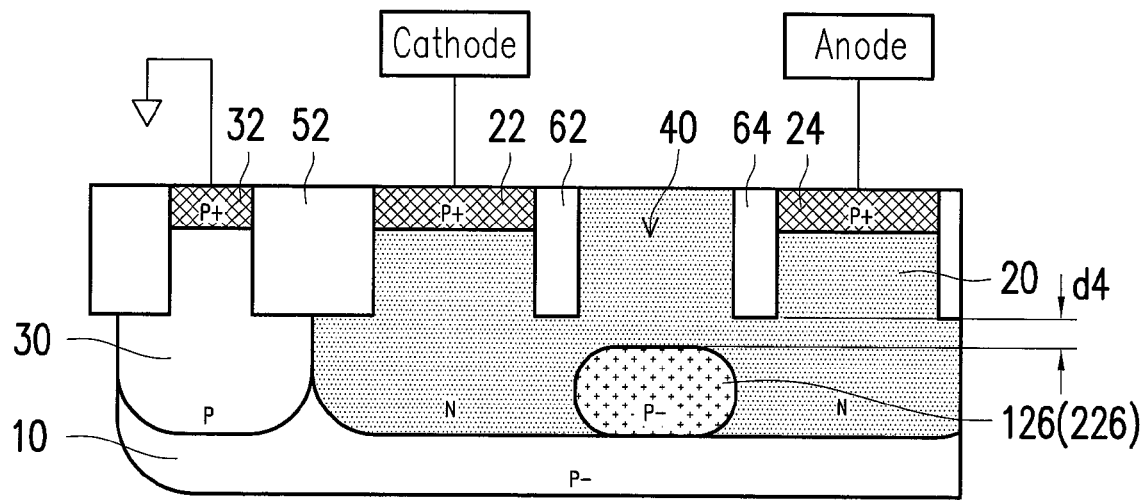
FIG. 8A illustrates a schematic cross-sectional diagram of line V-V in FIG. 7A.
Figure 8B:
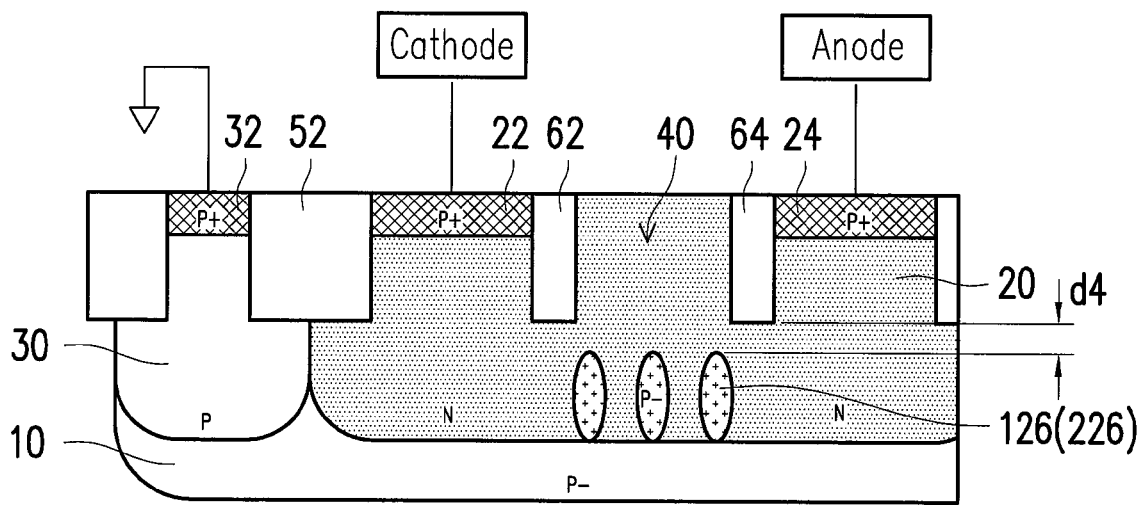
FIG. 8B illustrates a schematic cross-sectional diagram of line VI-VI in FIG. 7B.

FIG. 5 illustrates a top view of a lateral BJT of an embodiment of the invention. FIGS. 6A to 6D respectively illustrate a schematic cross-sectional diagram of one of the lateral BJTs of line IV-IV of FIG. 5. FIG. 7A and FIG. 7B respectively illustrate a top view of another lateral BJT of an embodiment of the invention. FIG. 8A illustrates a schematic cross-sectional diagram of line V-V in FIG. 7A. FIG. 8B illustrates a schematic cross-sectional diagram of line VI-VI in FIG. 7B.

Figure 6A:
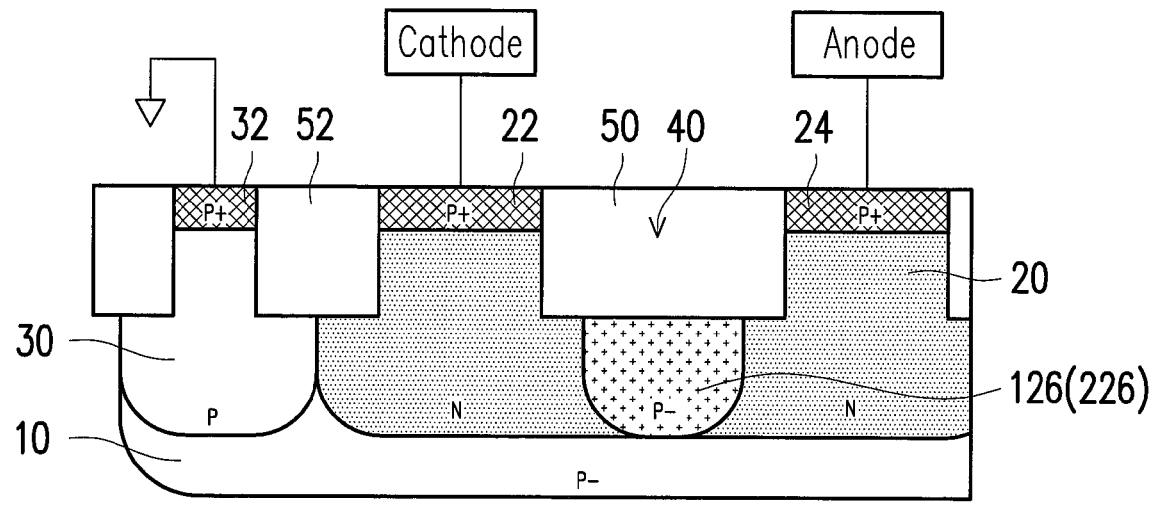
FIG. 6A illustrates a schematic cross-sectional diagram of one of the lateral bipolar junction transistors of line IV-IV of FIG. 5.

Referring to FIG. 5 and FIG. 6A, the area 40 has a single isolation structure 50 therein, and a lightly doped region 126 is below the isolation structure 50. The lightly doped region 126 is of the first conductivity type. The doping concentration of the lightly doped region 126 is lower than the doping concentration of each of the doped regions 22 and 24. In the present embodiment, the lightly doped region 126 is in contact with the isolation structure 50. Punch through occurs when the depletion region of the cathode covers the lightly doped region 126, thereby increasing the breakdown voltage of the lateral bipolar junction transistor.

Figure 6B:
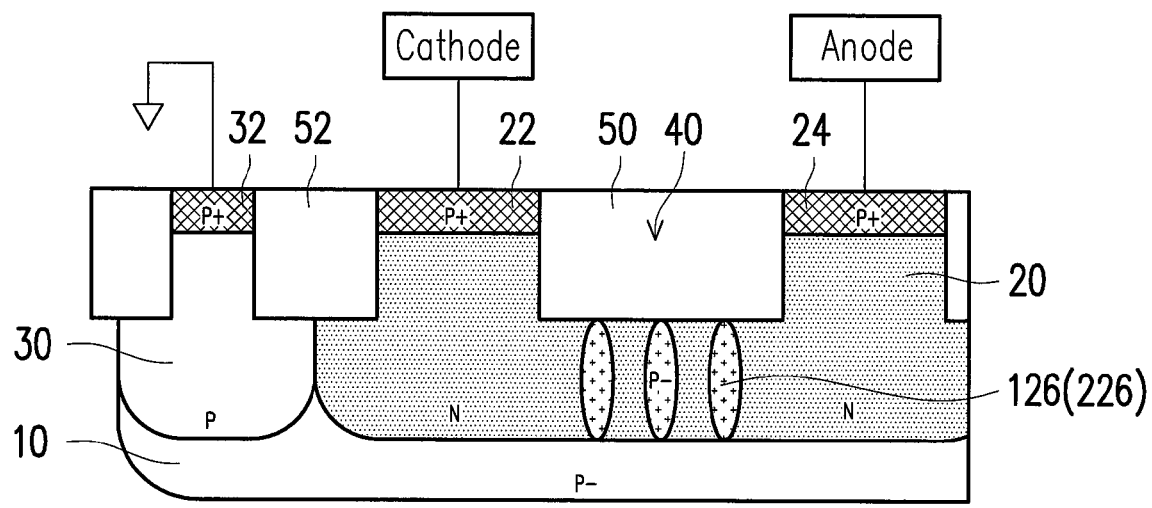
FIG. 6B illustrates a schematic cross-sectional diagram of another one of the lateral bipolar junction transistors of line IV-IV of FIG. 5.

Referring to FIG. 5 and FIG. 6B, the lateral BJT of each thereof is similar to the lateral BJT of FIG. 6A, but a plurality of lightly doped regions 126 of the first conductivity type are below the isolation structure 50 in each of the lateral BJTs of FIG. 5 and FIG. 6B. Since the conductivity type of the lightly doped region 126 is different from the conductivity type of the well region 20, it is similar to that plural PNPs are connected in series. Therefore, the breakdown voltage of the junction of the lightly doped region 126 and the well region 20 can be further increased.

Figure 6C:
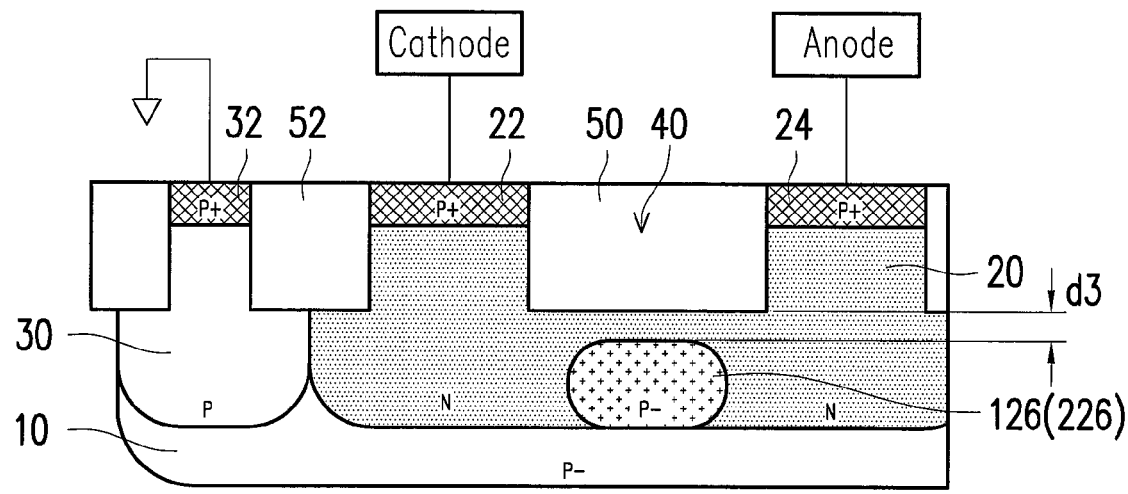
FIG. 6C illustrates a schematic cross-sectional diagram of yet another one of the lateral bipolar junction transistors of line IV-IV of FIG. 5.
Figure 6D:
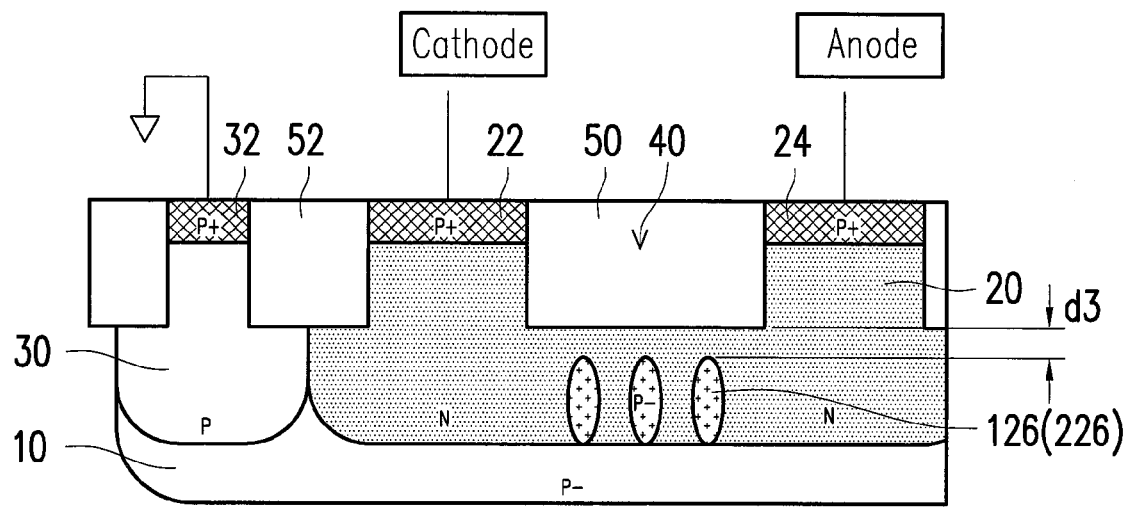
FIG. 6D illustrates a schematic cross-sectional diagram of still yet another one of the lateral bipolar junction transistors of line IV-IV of FIG. 5.

Referring to FIG. 5, FIG. 6C, and FIG. 6D, the lateral BJT of FIG. 6C is similar to the lateral BJT of FIG. 6A; the lateral BJT of FIG. 6D is similar to the lateral BJT of FIG. 6B, but the isolation structure 50 and the lightly doped region 126 of the first conductivity type below the isolation structure 50 are separated by a distance d3 and are not in contact. The distance d3 is, for instance, 0.05 μm to 1 μm. In comparison to a situation without the lightly doped region 126, in the present embodiment, the lightly doped region 126 is separated from the isolation structure 50 by the distance d3. As a result, the channel is smaller and current is confined in a small region, thereby increasing the breakdown voltage of the lateral bipolar junction transistor.

Referring to FIG. 7A, FIG. 7B, FIG. 8A, and FIG. 8B, in the present embodiment, two separate isolation structures 62 and 64 are disposed in the area 40. The isolation structure 62 is in contact with the doped region 22 and the isolation structure 64 is in contact with the doped region 24. The area 40 reserved between the isolation structure 62 and the isolation structure 64 is a portion of the area 20. The lightly doped region 126 of the first conductivity type is disposed below the region 40, is not in contact with the isolation structures 62 and 64, and is separated from the isolation structures 62 and 64 by a distance d4. The distance d4 is, for instance, 0.05 μm to 1 μm. Similarly, the lightly doped region 126 can be a single region as shown in FIGS. 7A and 8A; and the lightly doped region 126 can also be a plurality of regions as shown in FIG. 7B and FIG. 8B. In comparison to a situation without the lightly doped region 126, in the present embodiment, the lightly doped region 126 is separated from the isolation structure by the distance d4. As a result, the channel is smaller and current is confined in a small region, thereby increasing the breakdown voltage of the lateral bipolar junction transistor. However, in comparison to the situation of the embodiment of each of FIGS. 6C and 6D, in the present embodiment, the area 40 reserved between the isolation structure 62 and the isolation structure 64 can disperse an electric field to increase the effect of heat dissipation.

The lateral BJT of each embodiment above can be compatible with current fabrication process. Both the lightly doped region 26 of the same conductivity type as the well region 20 and the lightly doped region 126 of a different conductivity type from the well region 20 can be formed by a method of ion implantation and without additional photomasks.

The fabrication method of each of the lateral BJTs of the invention is explained in the following through FIG. 2A and FIG. 6A.

Referring to FIG. 2A, a well region 226 of the first conductivity type is formed in the substrate 10 by a method of ion implantation. Then, the well region 20 of the second conductivity type is formed in the substrate 10, wherein the well region 226 is in the well region 20, the well region 226 is partially overlapped with the well region 20, and the well region 226 can form the lightly doped region 26 (FIG. 2A) or the lightly doped region 126 (FIG. 6A) after the well region 20 is compensated. When the doping concentration of the well region 226 is lower than the doping concentration of the well region 20, after dopants of two different conductivity types are compensated, a portion of the doping of the second conductivity type of the well region 20 still can not be compensated, and therefore the lightly doped region 26 of the second conductivity type is formed. When the doping concentration of the well region 226 is higher than the doping concentration of the well region 20, after dopants of two different conductivity types are compensated, a portion of the doping of the first conductivity type of the well region 226 still can not be compensated, and therefore the lightly doped region 126 of the first conductivity type is formed.

Then, the doped regions 22 and 24 are formed in the well region 20, the well region 30 is formed in the substrate 20, the doped region 32 is formed in the well region 30, the isolation structure 50 is formed in the area 40, and the isolation structure 52 is formed between the doped regions 22 and 32. Then, the doped region 22 is connected to the cathode and the doped region 24 is connected to the anode.

The above embodiment is exemplified as forming a single lightly doped region 26 and 126; however, if the lateral BJT has a plurality of lightly doped regions 26 and 126 as shown in FIGS. 2B, 2D, 6B, and 6D, then a plurality of well regions 226 of the first conductivity type can be formed in the substrate 10 with a fabrication method similar to the above.

In the above embodiment, the lightly doped regions 26 and 126 are in contact with the isolation structure 50; however, if the lightly doped regions 26 and 126 of the lateral BJT are not in contact with the isolation structure 50 and are separated by the distance d1, d2, d3, or d4 as shown in FIGS. 2C, 2D, 4A, 4B, 6C, 6D, 8A, and 8B, then the well region 226 can be formed by controlling the parameter (such as energy or dose) of the ion implantation.

The formation method of each of the isolation structures 50, 52, 62, and 64 can be the same as the formation method of a known a shallow trench isolation structure and is not repeated herein.

Simulation experiments show that, in comparison to a BJT device without a lightly doped region, the breakdown voltage of the lateral BJTs of the invention can be increased from 8.5 volts to 9.2 volts, and therefore the lateral BJTs of the invention can be applied in high-speed devices or complementary metal-oxide semiconductor radio frequency devices.

Based on the above, the breakdown voltage of the lateral BJTs of the invention is increased by disposing a lightly doped region below an area between two doped regions. The conductivity type of the lightly doped region can be the same or different from the conductivity type of the well region. When the conductivity type of the lightly doped region is the same as the conductivity type of the well region, since the doping concentration of the lightly doped region is lower than the doping concentration of the well region, resistance can be increased. As a result, the voltage across the lightly doped region can be increased, and therefore the breakdown voltage of the lateral BJTs is increased. Punch through occurs when the conductivity type of the lightly doped region is different from the conductivity type of the well region and the depletion region of the cathode covers the lightly doped region, thereby increasing the breakdown voltage of the lateral BJTs.

The lightly doped region can be a single one or a plurality. When the lightly doped region is a plurality and the conductivity type of the lightly doped region is different from the conductivity type of the well region, it is similar to that plural PNPs are connected in series. Therefore, the breakdown voltage of the junction of the lightly doped region and the well region can be further increased.

Moreover, the lightly doped region is separated from the isolation structure by a distance, and therefore current can be confined in a small region to increase the breakdown voltage.

Furthermore, when the lightly doped region is disposed below the area between two isolation structures, in addition to increasing the breakdown voltage, electric fields can also be dispersed, thereby increasing the effect of heat dissipation.

Moreover, the fabrication methods of the lateral BJTs of the invention can be compatible with current fabrication process. The lightly doped region can be formed by a method of ion implantation and does not need additional photomasks.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A lateral bipolar junction transistor, comprising:
    a substrate of a first conductivity type;
    a well region of a second conductivity type in the substrate;
    an area in the well region;
    at least one lightly doped region in the well region below the area;
    a first doped region and a second doped region of the first conductivity type in the well region on both sides of the area, wherein the first doped region is connected to a cathode and the second doped region is connected to an anode,
    wherein a doping concentration of the at least one lightly doped region is lower than a doping concentration of each of the first doped region and the second doped region, and is lower than a doping concentration of the well region; and
    at least one isolation structure in the area, wherein the at least one isolation structure is adjacent to the first doped region and the second doped region.

2. The lateral bipolar junction transistor of claim 1, wherein the first conductivity type is P-type and the second conductivity type is N-type.

3. The lateral bipolar junction transistor of claim 1, wherein the first conductivity type is N-type and the second conductivity type is P-type.

4. The lateral bipolar junction transistor of claim 1, wherein the at least one lightly doped region is of the first conductivity type.

5. The lateral bipolar junction transistor of claim 1, wherein the at least one lightly doped region is of the second conductivity type.

6. The lateral bipolar junction transistor of claim 1, wherein the at least one lightly doped region is a single doped region.

7. The lateral bipolar junction transistor of claim 1, wherein the at least one lightly doped region is a plurality of doped regions.

8. The lateral bipolar junction transistor of claim 1, wherein the at least one lightly doped region is in contact with the at least one isolation structure.

9. The lateral bipolar junction transistor of claim 1, wherein the at least one lightly doped region is separated from the at least one isolation structure by a distance.

10. The lateral bipolar junction transistor of claim 1, wherein the at least one isolation structure comprises:
    a first isolation structure in the area and adjacent to the first doped region; and
    a second isolation structure in the area and adjacent to the second doped region.

* * * * *